US006785749B2

(12) United States Patent
Yu

(10) Patent No.: US 6,785,749 B2
(45) Date of Patent: Aug. 31, 2004

(54) APPARATUS AND METHOD FOR A PERIPHERAL INTER-MODULE EVENT COMMUNICATION SYSTEM

(75) Inventor: Zhenyu Yu, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 309 days.

(21) Appl. No.: 09/904,243

(22) Filed: Jul. 12, 2001

(65) Prior Publication Data

US 2002/0083229 A1 Jun. 27, 2002

Related U.S. Application Data

(60) Provisional application No. 60/267,589, filed on Feb. 9, 2001, provisional application No. 60/245,656, filed on Nov. 2, 2000, and provisional application No. 60/255,253, filed on Dec. 13, 2000.

(51) Int. Cl.[7] ............................................. G06F 13/00
(52) U.S. Cl. ........................................... 710/15; 714/47
(58) Field of Search ............................ 714/6–9, 42–55, 714/14; 710/62–64, 12–19, 72–74; 370/216, 385, 242

(56) References Cited

U.S. PATENT DOCUMENTS

| | | | | | |
|---|---|---|---|---|---|
| 4,607,330 | A | * | 8/1986 | McMurray et al. | 714/14 |
| 4,615,028 | A | * | 9/1986 | Lewis et al. | 370/385 |
| 5,644,700 | A | * | 7/1997 | Dickson et al. | 714/9 |
| 6,237,108 | B1 | * | 5/2001 | Ogawa et al. | 714/6 |

* cited by examiner

Primary Examiner—Christopher B. Shin
(74) Attorney, Agent, or Firm—William W. Holloway; W. James Brady; Frederick J. Telecky, Jr.

(57) ABSTRACT

An inter-module communication system provides for the exchange of status/event signals between interface modules monitoring the activity of external apparatus. The communication system includes a dedicated inter-modular control unit that collects status/event signals from the modules and an inter-modular control bus for distributing the status/event signals to the other modules. The status/event signals are applied to a multiplexer. The multiplexer can be programmed to transmit specified status/event signals. The specified status/event signals provide inter-modular coordination among the plurality of the modules without involvement of the device peripheral bus.

22 Claims, 4 Drawing Sheets

US 6,785,749 B2

APPARATUS AND METHOD FOR A PERIPHERAL INTER-MODULE EVENT COMMUNICATION SYSTEM

This application claims the benefit of U.S. Provisional Application No. 60/267,589 filed Feb. 9, 2001; U.S. Provisional Application No. 60/245,656 filed Nov. 2, 2000; and U.S. Provisional Application No. 60/255,253 filed Dec. 13, 2000.

CROSS REFERENCE TO RELATED APPLICATIONS

U.S. patent application Ser. No. 09/904,244 entitled "APPARATUS AND METHOD FOR A SIGNAL TRANSITION CAPTURE MODULE", invented by Zhenyu Yu, filed on even date herewith, and assigned to the assignee of the present application; and U.S. patent application Ser. No. 09/904,242 entitled "APPARATUS AND METHOD FOR AN ENCODER INTERFACE MODULE", invented by Zhenyu Yu, filed on even date herewith, and assigned to the assignee of the present application are related applications.

BACKGROUND OF THE INVENTION

1. Field of the Invention

This invention relates generally to microprocessor systems and, more particularly, to digital signal processor systems having a plurality of peripheral modules associated therewith. The peripheral modules of interest are interface modules that receive signals from sensor components, such as encoder units, that monitor parameters of external devices such as motors. The peripheral modules generate control signals that control external components. The control signals can activate elements such as switching power components.

2. Background of the Invention

The digital signal processor has proven to be well suited for inclusion in data processing systems wherein activity of an external device is monitored and controlled by the data processing system. In response to the signals from sensor elements monitoring the external device, appropriate status/event signals can be identified and, based on the status/event signals, control signals can be generated controlling the operation of the external component. For example, the status/event signals from the sensors/encoder units can be a train of pulses monitoring the operation of a motor and these identified status/event signals can be used to generate control signals that control the operation of the motor.

Referring to FIG. 1A, a processing system 1 for monitoring and controlling the activity of an external component 3 is shown. The processing system 1 includes a central processing unit 10, typically a digital signal processor core, and a peripheral device bus 5. Coupled to the peripheral device bus 5 are, for example, a memory unit 12, a serial communication interface (SCI) unit 13, a serial peripheral interface (SPI) unit 14, a multi-channel buffered serial port 15, an analog-to-digital converter (ADC) module 16, an encoder interface module 17, an event manager module 18, and a signal transition event capture module 19. The analog to digital module 16, the encoder interface module 17, the event manager module 18 and the signal transition capture module 19 receive signals from sensor units monitoring the external component 3. The event manager module 18 applies (control) signals to the component device 3.

The memory unit 12 provides for storage of data signal groups required by or generated by the central processing unit 10. The serial interface communication unit 13, the serial peripheral interface unit 14, and the multi-channel serial buffer unit 15 are interface modules that permit exchange of signals with other processing, communication, and display units (not shown). The analog to digital converter module 16 receives signals from a sensor unit in an analog format and converts these signals to a digital format for processing by the central processing unit 10. The encoder interface module 17 receives and processes signals from an encoder unit. The encoder interface module 17 has at least one group of signals applied thereto that is typically in the form of a series of pulses. For example, the series of pulses can provide timing and direction signals from an encoder unit monitoring a rotating shaft. The encoder interface unit 17 provides position and speed information about a monitored shaft rotation. The event manager module 18, according to one embodiment, can include a timer (or timers), compare unit(s) and other interface components. The event manager module 18 provides, among other activities, control signals to the external device 3 based on commands received from the central processing unit 10. The signal transition capture module 19 provides apparatus for associating pre-selected transition/events in the external apparatus with a time designation or time stamp.

Referring to FIG. 1B, an example of an external device 7 to which the interface modules can be advantageously coupled. The external device is a three-phase motor 75. The three-phase motor 75 is energized by an alternating voltage source that is applied to input terminals of rectifier 71. Coupled across the output terminals of rectifier 71 are a capacitor 72 and three pairs of power transistors 73A and 73B, 73C and 73D, and 73E and 73F, coupled in series. Each of the pairs of power transistors 73A and 73B, 73C and 73D, and 73E and 73F is coupled to the one of the three energizing coils of the motor. Hall effect sensors 76 associated with the motor 75 generate a series of pulses related to the rotation of the rotor of motor 75. These signals are applied to signal transition capture module 19. The current in the individual coils of the three-phase motor 71 can be monitored by current sensors 74A, 74B, and 74C. The signals from the current sensors 74A, 74B, and 74C are coupled through isolation element 81 to input terminals of the analog to digital convert module 16. Alternatively, the current can be monitored by resistances 731, 732, and 733 coupled in series with each of the power transistor pairs transistors 73A and 73B, 73C and 73D, and 73E and 73F, respectively. The voltages across these resistances 731, 732, and 733 can be applied to the analog to digital converter module 16. When the voltages across the resistances 731, 732 and 733 are sampled when the coupled power transistor (of the pair of power transistors) is conducting, an approximation of the current through the motor winding for each phase can be obtained. An optical encoder sensor 79 can optically monitor the rotation of the shaft (rotor) 751 of motor 75. Typically, the output signals of the optical encoder 79 are a first series of pulses related to the rotational speed of the motor shaft and a second series of pulses defining the direction of the rotation. The signals from the optical encoder are applied to encoder interface module 17. The control signals applied to the base terminals of the power transistor pairs 73A and 73B, 73C and 73D, and 73E and 73F originate in event manager unit 18 and are applied, through driver circuits 77.

While the forgoing data processing system 1 can acquire signals from an external component, determine status/event information, and provide control signals to the external components, greater flexibility and computational power is required. In particular, inter-module communication has proven necessary for coordinating activity of the modules.

For example, a specific parameter/event identified by the encoder interface module may be the parameter/event that triggers the activation of the analog to digital converter module 16. In the prior art, to activate the analog to digital converter module 16 based on a parameter identified by the encoder interface module 17, the central processing unit 10 would have to retrieve the parameter from the encoder interface module 17 by means of the peripheral device bus 5. The central processing unit 10 would then determine whether further action was indicated. In the present example, the further action is activation of the analog to digital converter module 16. The central processing unit 10 would then interact with the analog to digital converter module 16 by the peripheral device bus 5 to begin operation of the analog to digital converter module 16. The involvement of the central processing unit 10 and the device peripheral bus 5 increases the complexity of the system. Appropriate protocols must be present to provide the communication between the encoder interface module 17 and the central processing unit 12 to bring an identified event to the central processing unit 12. For example, the central processing unit 10 can periodically interrogate the encoder interface module 17 or the encoder interface module can place an interrupt signal on the peripheral device bus 5. Once the identified event is transferred to the central processing unit 12, the central processing unit must determine the appropriate response to the presence of the identified event and generate appropriate control signals. These control signals must then be transferred to analog to digital converter module 16 to activate the module 16. The activity of the peripheral device bus 5, such as a READ or WRITE activity, is controlled by the central processing unit 10. Because the peripheral device bus 5 is used in the communication between modules and the central processing unit 10, the communication can be delayed if the device peripheral bus 5 is engaged in a higher priority activity. In addition, the activity of the central processing unit 10 in determining whether further activity is required can compromise the execution of other processing activities.

It is also known in the prior art to couple directly the analog to digital converter module 16 and the encoder interface unit 17. In this manner, the encoder interface unit 17 can apply the appropriate control signals to the analog to digital converter unit 16 without the intervention of the peripheral bus 5 and the central processing unit 10. However, the direct coupling of the two modules provides reduced flexibility and a physical limit reached for the number of interconnections between the modules is soon reached. Thus, the number of identified events to which response can be made is severely limited. Direct connections between interface units also make it difficult to have standard peripheral module that permits a variable number of inter-module input and output events. The use of direct connections between interface units typically requires multiple versions of what is basically the same module.

A need has therefore been felt for apparatus and an associated method having the feature, in a processing system having modules receiving signals from an sensors coupled to an external component and modules for applying control signals to the external component, that preselected events identified in a first module can be communicated to a second module. It would be another feature of the apparatus and associated method that inter-module communication of the preselected events can be performed without undue additional complexity of the processing system. It would be yet another feature of the present invention that the inter-module communication is provided without the intervention of the central processing unit. It would be still another feature of the apparatus and associated method that the inter-module coupling can be controlled by the programming of the modules during the system initialization. It would be still a further feature of the apparatus and associated method that an interface module can accommodate a variable number of input and output inter-module events,

SUMMARY OF THE INVENTION

The aforementioned and other features can be accomplished, according to the present invention, by providing an inter-module controller receiving selected status/event signals from each of the modules and distributing the status/event signals to the other modules on a dedicated bus. Each interface module has selection apparatus for determining which sensor/event signals are to be transferred by the inter-module control unit. Each interface module includes apparatus for selecting which sensor/event signals are to be transferred from the dedicated bus to the module. According to one embodiment of the present invention, the selection of signals to be applied to the inter-module control unit and received from the dedicated bus is performed by applying appropriate signals to input and output multiplexer units included in the interface module. Implicit in this invention is the fact that the interface modules can provide event and control signals for distribution to other interface modules that, after initialization, do not require processing by the central processing unit.

BRIEF DESCRIPTION OF THE DRAWINGS

FIG. 1A is a block diagram of a processing system having a plurality of modules receiving signals from an external component according to the prior art, while

DESCRIPTION OF THE PREFERRED EMBODIMENTS

1. Detailed Description of the Figures

Figure 1A:
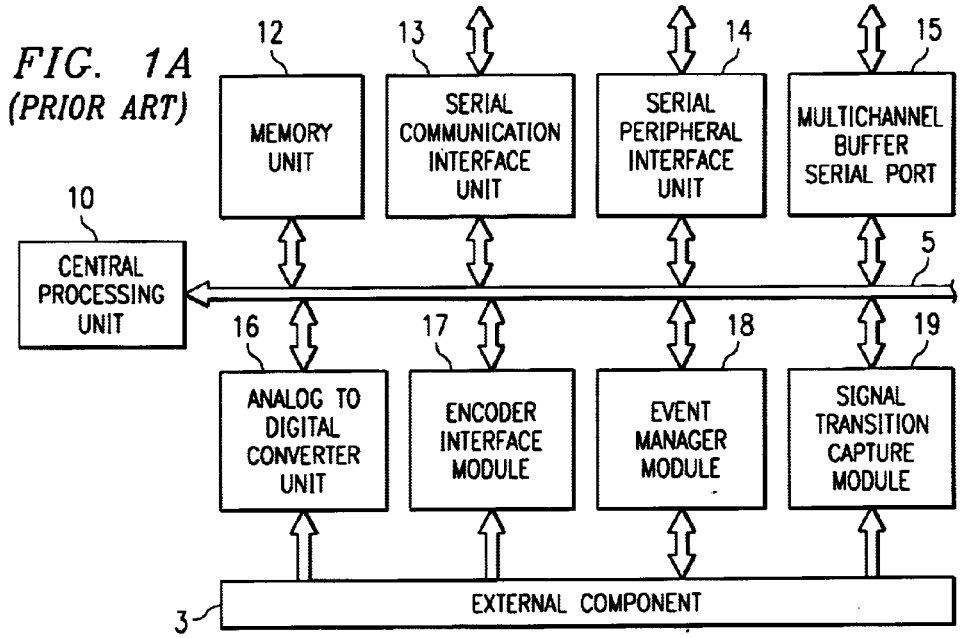
Figure 1B:
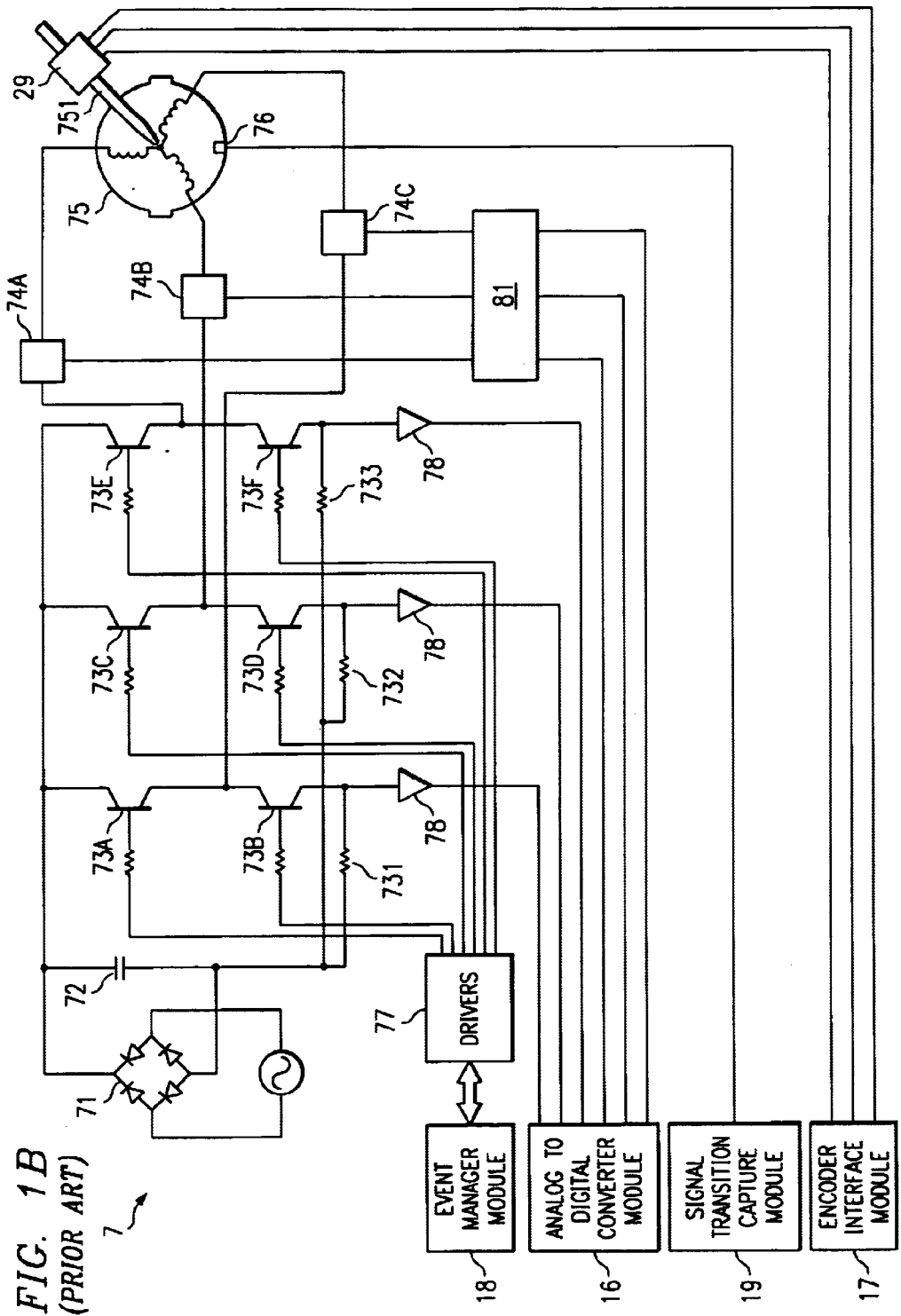
FIG. 1B is an example of an external device to which the interface modules of the present invention can be coupled.

FIG. 1A and FIG. 1B has been described with respect to the related art.

Figure 2:
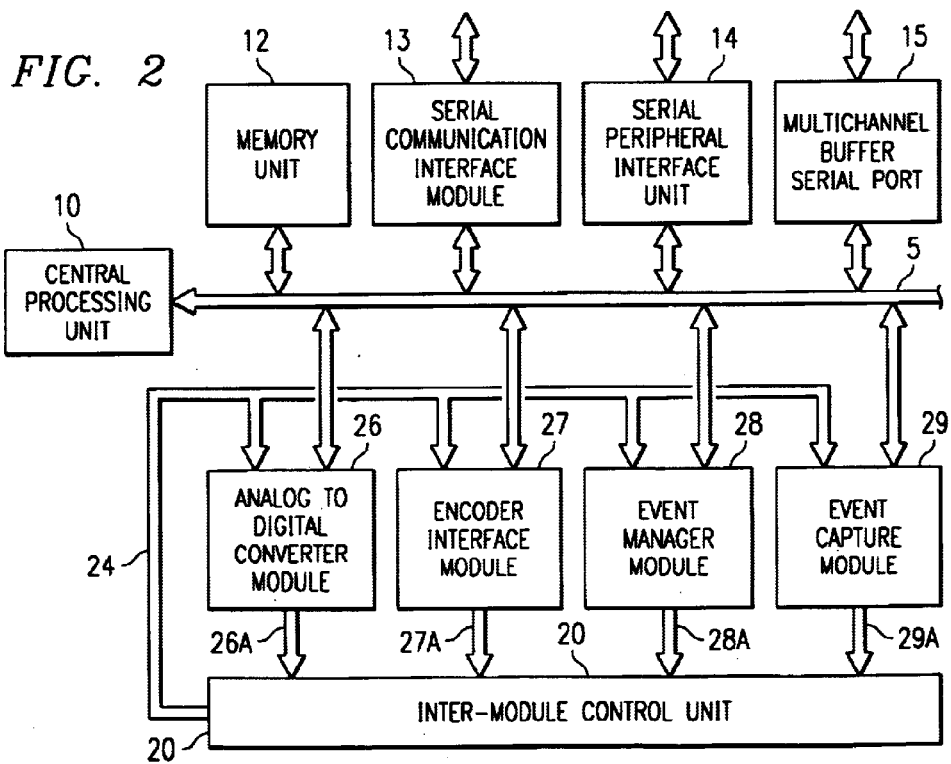
FIG. 2 is a block diagram of a processing system having a plurality of modules receiving signals from and applying signals to an external component and providing for inter-module communication according to the present invention.

Referring to FIG. 2, a block diagram of the event/signal processing system of FIG. 1 with the apparatus for inter-module communication, according to the present invention, is shown. The central processing unit 10, the device peripheral bus 5, the memory unit 12, the serial communications interface module 13, the serial peripheral interface unit 14, and the multichannel buffered serial port 15 are coupled as shown in FIG. 1. The analog to digital converter module 26, the encoder interface module 27, the event manager module 28 and the signal transition capture modules 29 are also coupled to the device peripheral interface bus 5 as shown in FIG. 1. These modules receive signals from sensor/encoder apparatus (not shown) monitoring external component (not shown). However, the implementation of the analog to digital converter module 26, the encoder interface module 27, the event manager module 28, and the signal transition capture module 29 are implemented differently than their counterparts in FIG. 1. In addition, inter-module control unit 20 has coupled thereto a bus 26A from analog to digital converter module 26, a bus 27A from encoder interface module 27, a bus 28A from event manager module 28 and a bus 29A from signal transition capture module 29. The present invention includes bus 24 that receives signals from the inter-module control unit 20 and applies signals to analog to digital converter module 26, encoder interface module 27, event manager module 28 and signal transition capture module 29.

Figure 3:
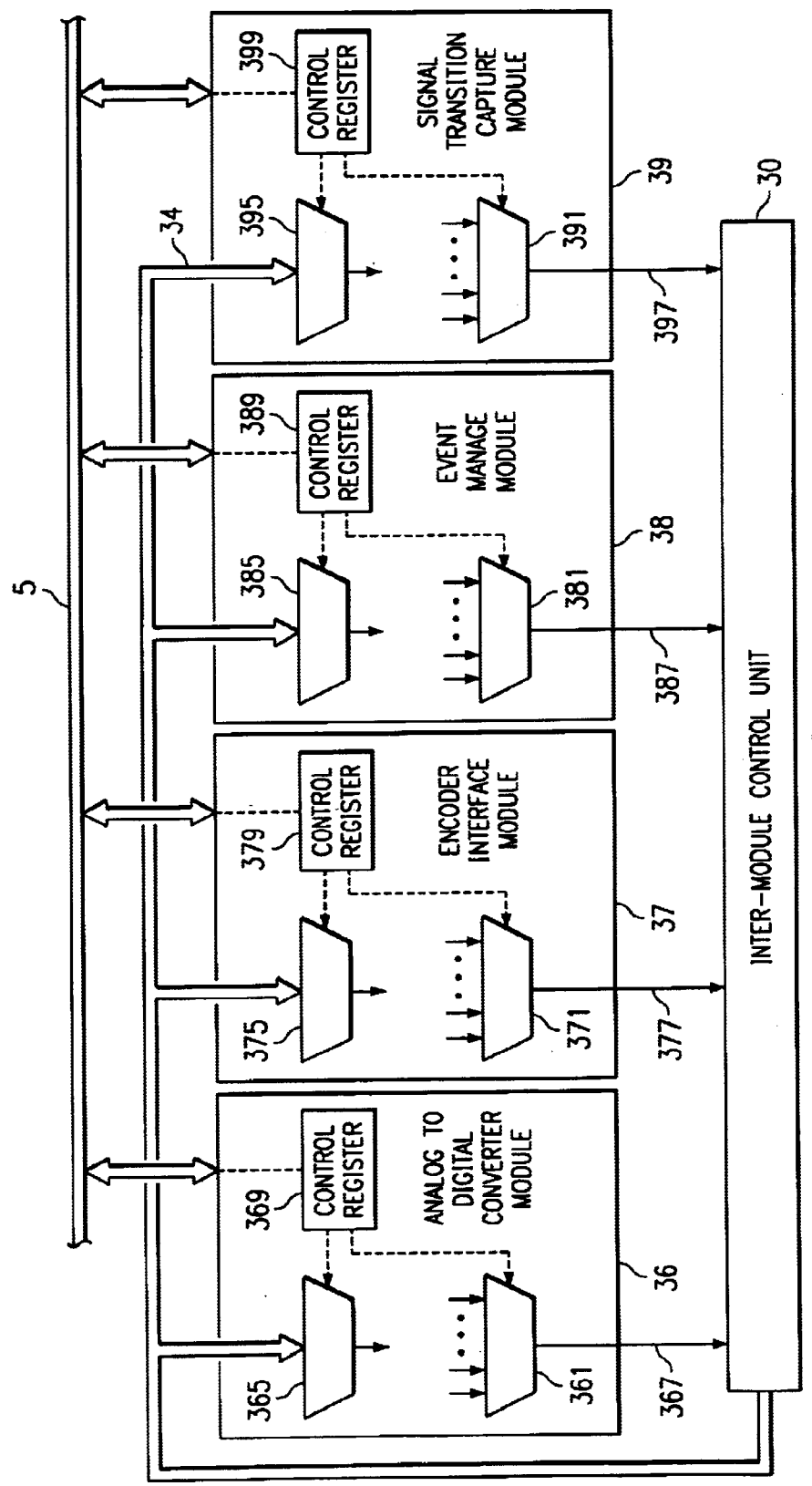
FIG. 3 is a simple embodiment for the inter-module distribution of the interface module signals according to the present invention.

Referring to FIG. 3, a first embodiment of the inter-event controller unit 30 and associated apparatus, illustrating the operation of the present invention is shown. Each module, i.e. the analog to digital converter module 36, the encoder interface module 37, the event manager unit 38, and the signal transition capture module 39, generate a signal in response to a selected event within the module. The analog to digital converter module 36 has a conductor 367 coupled to a multiplexer 361, encoder interface module 37 has a conductor 377 coupled to multiplexer 371, event manage module 38 has a conductor 387 coupled to multiplexer gate 381, and signal transition capture module 39 has a conductor 397 coupled to a multiplexer 391. Each of the multiplexers has a control signal applied thereto, the control signal determining when a signal generated within the module is applied to the coupled conductor. The multiplexers 361, 371, 381 and 391 can have a plurality of signals applied thereto. Each of the conductors 367, 377, 387 and 397 are coupled to inter-module control unit 30. In inter-module controller 30, the conductors are assembled into an inter-module control bus 34. The inter-module control bus 34 applies the conductors to multiplexer 365 of the analog to digital converter module 36, to multiplexer 375 of the encoder interface module 37, to multiplexer 385 of the event manager module 38, and to multiplexer 395 of the signal transition capture module 39. The signals applied to the output terminal of the module can be applied to the input multiplexer of the same module. For example, the signal from the encoder interface module 37 output multiplexer 371 can be applied to the encoder interface module 73 input multiplexer 375. The control signals applied to the module input multiplexer can be used to prevent the signal from being entered in the module issuing the signal when desired by the user. Selected signals from each module can therefore be applied to all the modules. It will be further clear that a plurality of signals can be developed within each interface module and the output multiplexer is used to select, by means of control signals applied to the output multiplexer, the particular signal to be applied to the inter-module control unit 30. Also shown with each module is a control register, e.g., control register 369 is included in analog to digital converter module 36. The control registers 369, 379, 389, and 399 are accessible to the central processing unit via the system bus 5. The selection of the transmission of the signal through the module output multiplexers 361, 371, 381, and 391 and the signal selection by the module input multiplexer 365, 375, 385, and 395 are determined by the contents of the control register 369, 379, 389, and 399, respectively. In this manner, the intermodule transfer of signals is programmable and is controlled by the central processing unit. As will be clear, in systems in which only one internal signal is generated in an interface module, the output multiplexer can be replaced by a gate element.

Figure 4:
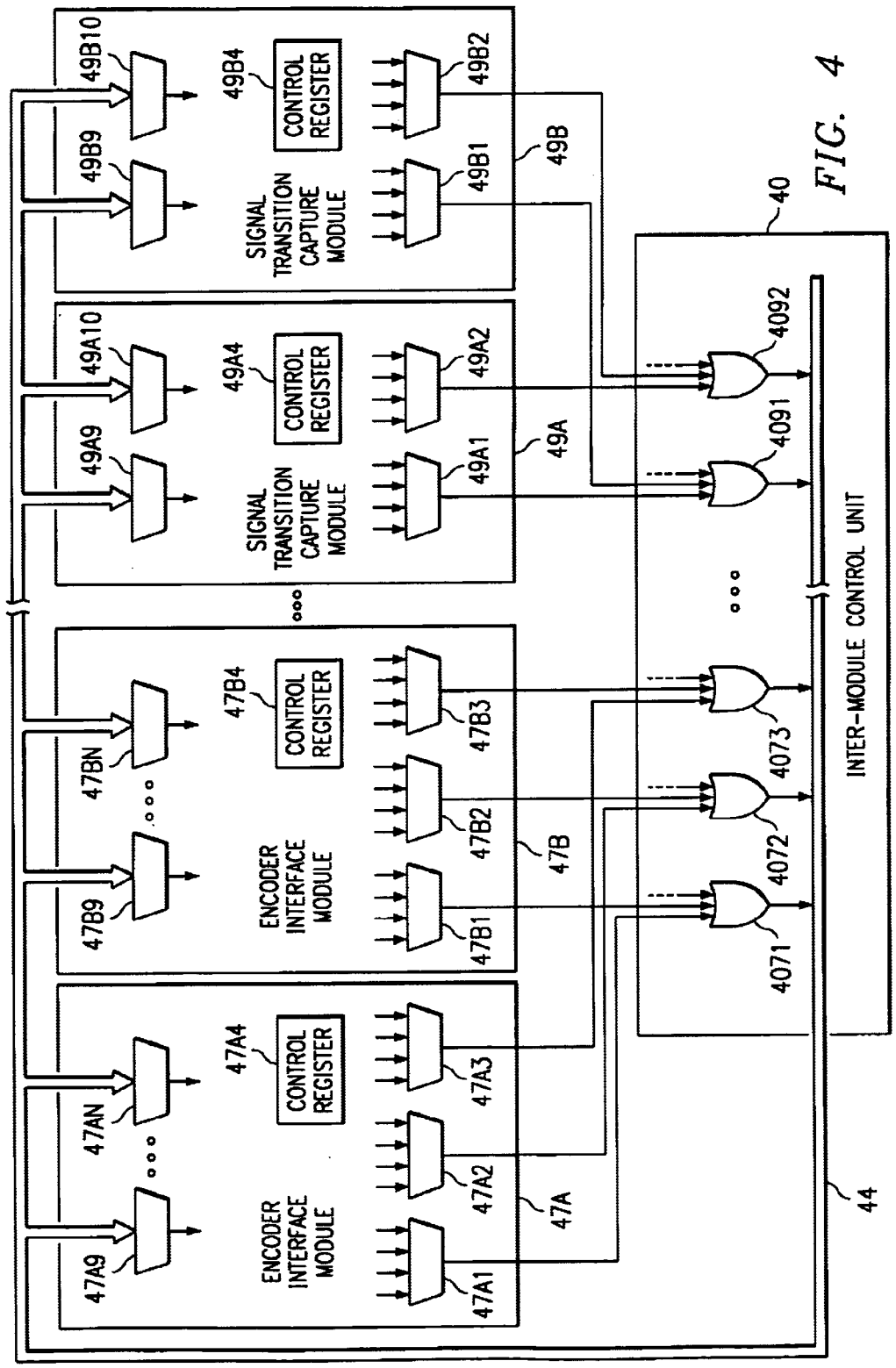
FIG. 4 illustrates a second embodiment of the present invention that provides for inter-module transfer of interface module signals.

Referring to FIG. 4, a second and more complex embodiment of the present invention is illustrated. The embodiment illustrated in FIG. 3 has been generalized in three ways. First, a plurality of each type of module can be present. For example, in FIG. 4, two encoder interface modules 47A and 47B are shown. The plurality of interface modules can be necessary when the input or output signals of a single module cannot accommodate the number of signals required by the system. Second, because each module can have the ability to generate a plurality of signals, each signal indicating the presence of different selected status/event, each module can have a more than one output multiplexer. For example, in FIG. 4, each encoder interface module 47A and 47B has three conductors (from three multiplexers) applied to the interface control module 40, while each signal transition capture module 49A and 49B has two conductors (from two multiplexers) coupled to the inter-module control unit 40. Each encoder interface module 47A and 47B can generate the same status/event signals. Each encoder interface module 47A and 47B can also be implemented such that the associated control register, 47A4 and 47B4, respectively, can be programmed to transmit different status/event signals to the output terminals of the output multiplexers 47A1, 47A2, and 47A3, and 47B1, 47B2, and 47C3. Similarly, the two encoder interface modules 49A and 49B are coupled to the inter-module controller unit 40. Each encoder interface module 49A and 49B can generate two status/event signals. In encoder interface unit 49A, for example, these two status/event signals are applied to output terminals of multiplexers 49A1 and 49A2 as determined by control signals from control register 49A4. In the inter-module control unit 40, a logic "OR" gate is provided for each of the three status/event signals generated in encoder interface modules 47A and 47B. These logic "OR" gates in the inter-module control unit are logic "OR" gate 4071, logic "OR" gate 4072, and logic "OR" gate 4073. The output terminal of multiplexer 47A1, the output terminal of multiplexer 47B1 are each coupled to an input terminal of logic "OR" gate 4071. The output terminal of multiplexer 47A2 and the output terminal of multiplexer 47B2 are each applied to an input terminal of logic "OR" gate 4072. The output terminal of multiplexer 47A3 and the output terminal of multiplexer 47B3 are each applied to an input terminal of logic "OR" gate 4073. Conductors coupled to the output terminals of logic "OR" gates 4071, 4072, and 4073 form part of the inter-module control bus 44. Similarly, in FIG. 4, two signal transition capture modules 49A and 49B are illustrated. Each of the signal transition capture modules 49A and 49B generates two status/event signals. The two status/event signals in signal transition capture unit 49A are applied to gate 49A1 and to 49A2, respectively. The two status/event signals generated in signal transition capture module 49B are applied to gates 49B1 and 49B2 respectively. Each of the two status/event signals generated in signal transition capture module 49A and in the signal transition capture module 49B have a logic "OR" gate in the inter-module control unit associated therewith. The output terminal of gate 49A1 of signal transition capture module 49A and the output terminal of gate 49B1 of signal transition capture module 49B are each coupled to an input terminal of logic "OR" gate 4091. The output terminal of gate 49A2 of event capture module 49A and the output terminal of gate 49B2 of gate 49B are each coupled to an input terminal of logic "OR" gate 4092. The output terminals of logic "OR" gates 4091 and 4092 are coupled to conductors that form part of the inter-module control bus 44. The third generalization is that each of the interface modules can have more than one input multiplexer. The inter-module control bus 44 is coupled to input terminals of multiplexers 47A9 through 47AN of the encoder interface module 47A, to input terminals of multiplexers 47B9 through 47BN of encoder interface module 47B, to input terminals of multiplexers 49A9 and 49A10 of signal transition capture module 49A, and to input terminals of multiplexers 49B9 through 49B10 of signal transition capture module 49B. The output terminals of the logic "OR" gates will also be coupled to the modules that are not explicitly shown in FIG. 4. As a practical matter, the analog to digital converter module(s) have the most frequent need for more than one input multiplexer.

As will be clear, the configuration shown in FIG. 4 is exemplary. Additional or different interface modules can be used with the inter-module control unit. Additional or fewer status/event signals can be generated in each module and applied to the inter-module control unit.

2. Operation of the Preferred Embodiment

In order to exchange status/event signals between modules in peripheral devices of data processing system, an inter-module control unit collects status/event signals from the peripheral interface modules. The status/event signals are then applied to an inter module control bus and then applied to the modules. Each module can be programmed to select one or more of the applied status/event signals and provide processing activity in the receiving module responsive to the selected status/event signal. Examples of the types of modules to which the inter-module collection unit can be coupled, as indicated above, are analog to digital converter modules, encoder interface modules, event manager modules, and signal transition capture modules. However, other types of modules are not precluded from being incorporated in the invention. The exchange of status/event signals can be used to coordinate the activity of the interface modules. The relatively simple implementation of the present invention along with the fact that the device peripheral bus is not involved minimizes the complexity of the invention.

As indicated above, the dedicated inter-module communication scheme of the present invention implies that in the encoder modules themselves, apparatus is present to provide the decision function that in the prior art would be accomplished by the central processing unit. The additional apparatus can include identification of external apparatus parameters and can include the ability to compare external apparatus parameters with preselected values.

As indicated by the Figures, the interface modules are coupled to the device peripheral bus. The central processing unit can communicate with the interface modules and specifically the control registers. The control registers determine the control signals to be applied to the control terminals of the input and output multiplexers of the peripheral interface modules. The input and output multiplexers determine the distribution of status/event signals to the inter-module control bus and which status/event signals are applied internally to the interface modules. Typically, the central processing applies the appropriate control signals to the control register during initialization.

In the preferred embodiment, signals from the interface units applied to the inter-module control unit are distributed to all of the interface units including the interface unit issuing the signals by the inter-module control bus. While the signals generated by an interface unit could be distributed within the generating interface unit without application to the inter-module control bus, the distribution by the inter-module control bus of all generated signals simplifies the design of the interface modules while permitting the central processing unit to control uniformly the distribution of all signals between the interface modules.

While the invention has been described with respect to the embodiments set forth above, the invention is not necessarily limited to these embodiments. Accordingly, other embodiments, variations, and improvements not described herein are not necessarily excluded from the scope of the invention, the scope of the invention being defined by the following claims.

What is claimed is:

1. A processing system comprising:
a central processing unit;
a device peripheral bus;
a plurality of peripheral modules coupled to the peripheral device bus, each peripheral module including a control register, each peripheral module generating selected status/event signals, the selected status event signals determined by control signals from the control register;
an inter-module bus coupled to each of the modules; and
an inter-module controller unit coupled to the peripheral modules, the inter-module control unit receiving at status/event signals from each module coupled thereto, the inter-module controller applying the selected status/event signals to the inter-module bus, the inter-module bus applying status/event signals from other modules to each module, each module entering preselected status/event signals therein, the preselected status/event signals determined by control signals from the control register.

2. The processing system as recited in claim 1 wherein each module includes:
a multiplexer, the multiplexer responsive to control signals from the control register, the multiplexer selecting a preselected status/event signal from the inter-modular bus to be entered in the module.

3. The processing system as recited in claim 2, the inter-modular control unit including a logic "OR" gate, the logic "OR" gate having a plurality of input terminals, the same status/event signal generated by at least two instances of peripheral modules each being applied to an input terminal of the logic "OR" gate.

4. The processing system as recited in claim 3 wherein the output terminal of the logic "OR" gate is coupled to the input terminals of multiplexers in the modules not generating the status/event signals.

5. The processing system as recited in claim 3 wherein the modules are selected are interface modules receiving signals from sensors and encoder devices.

6. The processing system as recited in claim 5 wherein at least one of the modules is selected from the group consisting of an analog to digital converter module, an encoder interface module, an event manager module, and a capture module.

7. The processing system as recited in claim 1 wherein the contents of the control register are entered by the central processing unit.

8. The processing system as recited in claim 7 wherein the inter-module control unit and the inter-module bus are used to coordinate activity between the modules.

9. In a data processing unit having a central processing unit, a device peripheral bus, and a plurality of modules coupled to the device peripheral bus; each module programmed to generate selected status/event signals, each module programmed to enter therein preselected status/event signals, each module having a control register applying control signals determining the selected status/event signals and preselected status event signals, an inter-module communication system comprising:
an inter-module bus for applying the preselected status/event signals to modules not generating the status/event signals; and
an inter-module control unit receiving the selected status/event signals from the modules, the inter-module control unit applying the selected status/event signals to the inter-module bus, wherein the same status/event signals generated by equivalent modules are transmitted by the inter-module bus on the same conducting path.

10. The inter-module communication system as recited in claim 9 wherein the inter-module control unit includes at least one logic "OR" gate, the same status/event signal generated by equivalent modules being applied to different terminals of a logic "OR" gate.

11. The inter-module communication system as recited in claim 10 wherein the output terminal of the logic "OR" gate is coupled to modules not generating the same status/event signal.

12. The inter-module communication system as recited in claim 11 wherein a plurality of status/event signals is applied to each module.

13. The inter-module communication system as recited in claim 12 wherein the exchange of signals among the modules provides coordination of activity among the modules.

14. The inter-module communication system as recited in claim 13 wherein the modules receive input signals from sensor/encoder devices that describe physical characteristics of external apparatus.

15. The inter-module communication system as recited in claim 9 wherein the contents of the control register are entered by the central processing unit.

16. A method for exchanging status/event signals among a plurality of modules, the method comprising:

in each module, programming the module to generate at least one selected status/event signal;

applying each status/event signal to a inter-module control unit;

collecting the same status/event signals from equivalent modules;

distributing the status/event signals to the modules not generating the same status/event signals;

programming each module to enter therein only a preselected status/event signal.

17. The method as recited in claim 16 further comprising programming the module by entering control signals from the central processing unit in a module control register.

18. The method as recited in claim 17 wherein the collecting of the same status/event signals includes applying the same status/event signal to different terminals of a logic "OR" gate.

19. The method as recited in claim 18 wherein the selecting is implemented by applying the status/event signal to input terminals of a multiplexer and applying appropriate control signals from the control register to the control terminals of the multiplexer.

20. The method as recited in claim 19 wherein the generating of status/event signals includes generating a plurality of status/event signals in each module.

21. The method as recited in claim 20 further comprising the step of coordinating the activity of a plurality of modules by the distribution of status/event signals.

22. The method as recited in claim 21 wherein the status/event signals describe physical properties of an external apparatus.

* * * * *